(12) United States Patent
Fukushima et al.

(10) Patent No.: US 8,513,694 B2
(45) Date of Patent: Aug. 20, 2013

(54) NITRIDE SEMICONDUCTOR DEVICE AND MANUFACTURING METHOD OF THE DEVICE

(75) Inventors: Yasuyuki Fukushima, Kagoshima (JP); Tetsuzo Ueda, Osaka (JP)

(73) Assignee: Panasonic Corporation, Osaka (JP)

( * ) Notice: Subject to any disclaimer, the term of this patent is extended or adjusted under 35 U.S.C. 154(b) by 89 days.

(21) Appl. No.: 13/224,028

(22) Filed: Sep. 1, 2011

(65) Prior Publication Data

US 2011/0309400 A1  Dec. 22, 2011

Related U.S. Application Data

(63) Continuation of application No. PCT/JP2010/000996, filed on Feb. 17, 2010.

(30) Foreign Application Priority Data

Mar. 4, 2009  (JP) ................................. 2009-050746

(51) Int. Cl.
*H01L 33/00* (2010.01)
*H01L 21/00* (2006.01)

(52) U.S. Cl.
USPC ........ 257/98; 257/101; 257/E33.001; 438/40; 438/43

(58) Field of Classification Search
None
See application file for complete search history.

(56) References Cited

U.S. PATENT DOCUMENTS

| | | | |
|---|---|---|---|
| 5,306,662 A | 4/1994 | Nakamura et al. | |
| 5,814,533 A | 9/1998 | Shakuda | |
| 6,841,808 B2 * | 1/2005 | Shibata et al. | 257/190 |
| 7,235,816 B2 * | 6/2007 | Takahashi et al. | 257/94 |
| 7,504,667 B2 * | 3/2009 | Fujikura et al. | 257/98 |
| 7,763,907 B2 * | 7/2010 | Tachibana et al. | 257/99 |
| 7,875,874 B2 * | 1/2011 | Yoon et al. | 257/13 |
| 2002/0014629 A1 * | 2/2002 | Shibata et al. | 257/79 |
| 2005/0056850 A1 * | 3/2005 | Taki | 257/79 |
| 2008/0179623 A1 | 7/2008 | Tachibana et al. | |
| 2010/0230714 A1 | 9/2010 | Shinohara et al. | |

FOREIGN PATENT DOCUMENTS

| | | |
|---|---|---|
| JP | 08-032113 | 2/1996 |
| JP | 08-051235 | 2/1996 |
| JP | 2540791 | 10/1996 |
| JP | 2785253 | 8/1998 |
| JP | 2003-069075 | 3/2003 |
| JP | 2006-147787 | 6/2006 |
| JP | 2006-339427 | 12/2006 |

(Continued)

OTHER PUBLICATIONS

Norikatsu Koide et al., "Carbon Incorporation on (1101) Facet of AlGaN in Metal Organic Vapor Phase Epitaxy," Japanese Journal fo Applied Physics, col. 45, No. 10A, pp. 7655-7660.

(Continued)

*Primary Examiner* — Alonzo Chambliss
(74) *Attorney, Agent, or Firm* — McDermott Will & Emery LLP

(57) ABSTRACT

A nitride semiconductor device includes a first nitride semiconductor layer having a C-plane as a growth surface, and unevenness in an upper surface; and a second nitride semiconductor layer formed on the first nitride semiconductor layer to be in contact with the unevenness, and having p-type conductivity. The second nitride semiconductor layer located directly on a sidewall of the unevenness has a p-type carrier concentration of $1 \times 10^{18}/cm^3$ or more.

27 Claims, 13 Drawing Sheets

(56) References Cited

FOREIGN PATENT DOCUMENTS

| | | |
|---|---|---|
| JP | 2007-258446 | 10/2007 |
| JP | 2008-034754 | 2/2008 |
| JP | 2008-182069 | 8/2008 |
| JP | 2008-230868 | 10/2008 |

OTHER PUBLICATIONS

T. Hikosaka et al., "Optical and electrical properties of (1-101)GaN grown on a 7° off-axis (001)Si substrate," Applied Physics Letters, vol. 84, No. 23, pp. 4717-4719, 2004.

* cited by examiner

NITRIDE SEMICONDUCTOR DEVICE AND MANUFACTURING METHOD OF THE DEVICE

CROSS-REFERENCE TO RELATED APPLICATION

This is a continuation of PCT International Application PCT/JP2010/000996 filed on Feb. 17, 2010, which claims priority to Japanese Patent Application No. 2009-050746 filed on Mar. 4, 2009. The disclosures of these applications including the specifications, the drawings, and the claims are hereby incorporated by reference in their entirety.

BACKGROUND

The present disclosure relates to p-type nitride semiconductor layers applicable to semiconductor devices such as light-emitting diodes and semiconductor lasers and manufacturing methods of the layers, and nitride semiconductor devices using the p-type nitride semiconductor layers and manufacturing method of the devices.

So-called nitride semiconductor made of GaN, InN, AlN, and an alloy crystal of the materials has a band gap corresponding to the wavelength region ranging from a visible region to an ultraviolet region. The nitride semiconductor is a material which realizes a high-output light-emitting diode in a wavelength range from green or blue to ultraviolet. Since the quality was improved on a sapphire substrate, and p-type GaN was realized, the materials have been applied to a semiconductor laser and a highly luminescent light-emitting diode (LED) and practically used.

A technique of obtaining a p-type nitride semiconductor layer having low resistivity by doping a nitride semiconductor layer with p-type impurities of Mg, and annealing at a temperature of 400° C. or more, when forming the structure of a nitride semiconductor light-emitting device on a sapphire substrate or a Si substrate by crystal growth using the C-plane (0001) as a growth surface is suggested. (See, for example, Japanese Patent No. 2540791.) Since the technique was published, various research institutes have researched p-type nitride semiconductor. For example, Japanese Patent Publication No. H08-32113 shows reducing cooling velocity after crystal growth. Japanese Patent Publication No. H08-51235 shows performing annealing of an electrode and a p-type layer at the same time. On the other hand, p-type impurities replacing Mg are researched, and a report teaches that a narrow level is formed to provide an excellent p-type nitride semiconductor layer by implanting carbon (C) using the (1-101) plane different from the C-plane (0001) as a growth surface. (See, for example, T. Hikosaka, T. Narita, Y. Honda, M. Yamaguchi, and N. Sawaki, Appl. Phys. Lett. 84, 4717 (2004); and Norikatsu KOIDE, Toshiki HIKOSAKA, Yoshio HONDA, Masahito YAMAGUCHI and Nobuhiko SAWAKI, Jpn. J. Appl. Phys., 45, 7655 (2006).)

SUMMARY

Although a p-type layer is obtained by annealing, a carrier concentration of the layer is merely less than $1\times10^{18}/cm^3$. A p-type layer with a higher carrier concentration is required for an improvement in electrical characteristics of a nitride semiconductor light-emitting device. Also, when annealing is needed, the number of steps increases to increase manufacturing costs. Furthermore, there is the problem that implanted Mg is diffused to a light-emitting layer. When Mg is diffused, a crystal defect occurs in the light-emitting layer, thereby reducing internal quantum efficiency to significantly reduce luminous efficiency. On the other hand, other examples of the above-described light-emitting device are shown in T. Hikosaka, T. Narita, Y. Honda, M. Yamaguchi, and N. Sawaki, Appl. Phys. Lett. 84, 4717 (2004), and Norikatsu KOIDE, Toshiki HIKOSAKA, Yoshio HONDA, Masahito YAMAGUCHI and Nobuhiko SAWAKI, Jpn. J. Appl. Phys., 45, 7655 (2006). As shown in these documents, when carbon (C) is implanted into a GaN layer using the (1-101) plane different from the C-plane (0001) as a growth surface for growth, a p-type layer with low resistivity is obtained. However, conditions for growth on the C-plane (0001) cannot be utilized. Also, at present, a substrate formed by processing an off-substrate, of which the (001) plane of Si is inclined at an angle of 7°, to have unevenness needs to be used to increase the number of steps, thereby increasing manufacturing costs.

It is an objective of the present disclosure to form a p-type nitride semiconductor layer with a high carrier concentration and low resistivity without annealing or processing of a substrate.

In order to achieve the objective, a nitride semiconductor device according to the present disclosure includes a first nitride semiconductor layer having a C-plane as a growth surface, and unevenness in an upper surface, and a second nitride semiconductor layer formed on the first nitride semiconductor layer to be in contact with the unevenness, and having p-type conductivity. The second nitride semiconductor layer located directly on a sidewall of the unevenness has a p-type carrier concentration of $1\times10^{18}/cm^3$ or more.

With this structure, an excellent p-type nitride semiconductor layer with high hole concentration of $10^{18}$ cm$^{-3}$ or more is obtained without using annealing for activating p-type impurities, which has been conventionally required. Also, since there is no need to process a substrate, the number of steps decreases so that the device can be manufactured at low costs.

In the nitride semiconductor device of the present disclosure, carbon (C) is preferably implanted into the second nitride semiconductor layer as p-type impurities.

In the nitride semiconductor device of the present disclosure, at least one of Mg, Zn, Ca, or Be is preferably implanted as the p-type impurities in addition to the C. With this feature, even when the first nitride semiconductor layer and the unevenness of the second nitride semiconductor include the C-plane (0001), the second nitride semiconductor more effectively exhibits p-type conductivity with low resistivity. Mg, Zn, Ca, Be, etc. are stabilized in the lattice of the group III site, and C is stabilized in the lattice of the group V site. Therefore, C can be implanted at the same time of implanting Mg, Zn, Ca, Be, etc.

In the nitride semiconductor device of the present disclosure, p-type impurities are preferably distributed along a form of the unevenness at the interface between the first nitride semiconductor layer and the second nitride semiconductor layer.

In the nitride semiconductor device of the present disclosure, a surface of a sidewall of the unevenness has preferably mainly nitrogen polarity. With this feature, C is easily implanted into the second nitride semiconductor layer which is formed in contact with the sidewall of the unevenness. Since the surface of the nitrogen polarity is terminated with nitrogen, substitution of C tends to occur and thus, the feature is advantageous in implanting C.

In the nitride semiconductor device of the present disclosure, a sidewall of the unevenness preferably includes a surface having plane orientation of a (1-101) plane, a (11-22) plane, or a (1-102) plane. With this structure, the second nitride semiconductor layer more effectively exhibits p-type conductivity with low resistivity. In particular, the (1-101) plane and the (11-22) plane have nitrogen polarity, and thus, C can be efficiently implanted. Note that the indication of the plane orientation is not limited to the above indication and may be different, as long as the indication is of mathematically substantially the same nature.

In the nitride semiconductor device of the present disclosure, at least one of Si or Ge is implanted into the second nitride semiconductor layer. This feature enables control of the hole concentration. For example, carbon (C) is contained in trimethylgallium (TMG), trimethylindium (TMI), trimethylaluminum (TMA), etc. which are Group III materials, and C is naturally implanted. Thus, the controllability of the hole concentration is not always good. Thus, at least one of Si or Ge is implanted into the second nitride semiconductor layer, thereby causing n-type carriers due to Si or Ge to compensate holes, and thus, a preferable hole concentration can be set.

In the nitride semiconductor device of the present disclosure, the unevenness is preferably in a form of a hexagonal pyramid or a truncated hexagonal pyramid. This structure reduces the surface area of the C-plane (0001), and increases the surface area of a sidewall of the unevenness, thereby increasing the area of the second nitride semiconductor having p-type conductivity with low resistivity. This necessarily lowers a resistance value of the p-type layer to lower Vop and Vf. In particular, the hexagonal pyramid is preferable. When the inclined surface of the hexagonal pyramid is used in a light-emitting device, an improvement in light pick-up efficiency can be expected at the same time.

Another nitride semiconductor device according to the present disclosure includes: an n-type nitride semiconductor layer, a light-emitting layer, and a first p-type nitride semiconductor layer, which are sequentially formed using a C-plane as a growth surface. Unevenness is provided in the first p-type nitride semiconductor layer. A second p-type nitride semiconductor layer formed on the first p-type nitride semiconductor layer to be in contact with the unevenness is further provided. The second p-type nitride semiconductor layer located directly on a sidewall of the unevenness has a p-type carrier concentration of $1 \times 10^{18}/cm^3$ or more.

With this structure, an excellent p-type nitride semiconductor layer with a high hole concentration of $10^{18}$ cm$^{-3}$ or more is obtained without using annealing for activating p-type impurities, which has been conventionally required. Also, there is no need to process a substrate, the number of steps decreases so that the device can be manufactured at low costs. Furthermore, since a semiconductor layer having p-type conductivity with low resistivity can be obtained, a light-emitting device having a lower forward voltage (Vf) than a conventional device can be provided.

The nitride semiconductor device of the present disclosure may further include edge dislocation directly under recesses of the unevenness. With this feature, the unevenness can be in-situ formed by pit growth starting at the edge dislocation, thereby reducing costs.

In the nitride semiconductor device of the present disclosure, the edge dislocation is preferably not provided in the light-emitting layer located directly under the recesses of the unevenness. This feature prevents reduction in luminous efficiency even when currents are concentrated directly under the recesses, since the edge dislocation is not provided in the light-emitting layer located directly under the recesses.

The nitride semiconductor device of the present disclosure preferably further include a periodic structure provided between the first p-type nitride semiconductor layer and the light-emitting layer, and made of nitride semiconductor. The periodic structure preferably changes a direction of the edge dislocation. With this feature, the recesses are directly formed on the edge dislocation of which direction is changed between light-emitting layer and the first p-type nitride semiconductor layer, and thus, a structure without dislocation in the light-emitting layer directly under the recesses can be obtained. This prevents reduction in luminous efficiency.

In the nitride semiconductor device of the present disclosure, the periodic structure is preferably formed by periodically stacking nitride semiconductor layers of different composition. Each of the layers of the periodic structure preferably contains at least one of In, Al, or Ga as a constituent element.

The nitride semiconductor device of the present disclosure may further include a nanomask provided between the first p-type nitride semiconductor layer and the light-emitting layer. Recesses of the unevenness may be located directly on the nanomask. With this structure, a difference in lattice constant causes three-dimensional growth to in-situ form the unevenness, thereby reducing costs. Furthermore, dislocation is not needed, the unevenness can be formed without reducing luminous efficiency.

In the nitride semiconductor device of the present disclosure, the nanomask is preferably made of $Al_xGa_{1-x}N$, where $0<x\leq1$, SiN, or SiC. This feature facilitates three-dimensional growth to in-situ form the nanomask, thereby reducing costs.

A manufacturing method of a nitride semiconductor device according to the present disclosure includes: (a) forming a first nitride semiconductor layer on a substrate using a C-plane as a growth surface; (b) forming unevenness on a surface of the first nitride semiconductor layer; and (c) forming a second p-type nitride semiconductor layer to be in contact with the unevenness of the first nitride semiconductor layer.

With this method, an excellent p-type nitride semiconductor layer with a high hole concentration of $10^{18}$ cm$^{-3}$ or more is obtained without using annealing for activating p-type impurities, which has been conventionally required. Also, there is no need to process a substrate or nitride semiconductor device, the number of the steps decreases so that the device can be manufactured at low costs.

In the manufacturing method of the nitride semiconductor device of the present disclosure, carbon (C) is preferably implanted into the second nitride semiconductor layer as p-type impurities in the (c).

Another manufacturing method of a nitride semiconductor device of the present disclosure includes: (a) sequentially forming an n-type nitride semiconductor layer, a light-emitting layer, and a first p-type nitride semiconductor layer on a substrate using a C-plane as a growth surface, (b) forming unevenness on a surface of the first p-type nitride semiconductor layer, and (c) forming a second p-type nitride semiconductor layer formed to be in contact with the unevenness of the first nitride semiconductor layer.

The manufacturing method of the nitride semiconductor device of the present disclosure may further include after the (c): (d) exposing the n-type nitride semiconductor layer by removing parts of the second p-type nitride semiconductor layer and the light-emitting layer; (e) forming a positive electrode transmissive to light with a light-emitting wavelength of the light-emitting layer on the second p-type nitride semiconductor layer; and (f) forming a negative electrode on the exposed surface of the n-type nitride semiconductor layer.

The manufacturing method of the nitride semiconductor device of the present disclosure may further include after the (c): (g) removing the substrate, and (h) forming a metal film of a single layer or a multilayer reflecting light with a light-emitting wavelength of the light-emitting layer on an exposed surface of the n-type nitride semiconductor layer exposed by removing the substrate.

This manufacturing method improves luminous efficiency to enable manufacture of a light-emitting device with reduced deterioration in light absorption, stress and heat dissipation of a substrate.

In the manufacturing method of the nitride semiconductor device of the present disclosure, the metal film preferably has a thickness of 10 μm or more in the (h). This method improves heat dissipation characteristics.

In the manufacturing method of the nitride semiconductor device of the present disclosure, at least a part of the metal film is preferably formed by plating in the (h). This method enables formation of the metal film at high speed and manufacture of the light-emitting device at low costs.

In the manufacturing method of the nitride semiconductor device of the present disclosure, the metal film is preferably made by at least one of Cu, Ag, Al, or Au in the (h). This method enables formation of the metal film having high reflectivity to light irradiated from the light-emitting layer and excellent heat dissipation characteristics.

As compared to a conventional p-type nitride semiconductor layer obtained by implanting Mg into a nitride semiconductor layer and performing annealing, the present disclosure provides an excellent p-type nitride semiconductor layer with a high carrier concentration. Since the p-type nitride semiconductor layer with the high carrier concentration can be obtained without using annealing for activating p-type impurities, the number of steps decreases to significantly reduce costs. When the p-type nitride semiconductor layer obtained in this manner is used in the structure of, for example, a light-emitting device, a light-emitting device with a lower forward voltage (Vf) than a conventional device can be provided. Furthermore, since the p-type nitride semiconductor layer with the high carrier concentration can be obtained without using Mg, impurity diffusion into the light-emitting layer can be reduced, thereby enabling highly efficient light emitting.

DETAILED DESCRIPTION

First Exemplary Embodiment

Figure 1:
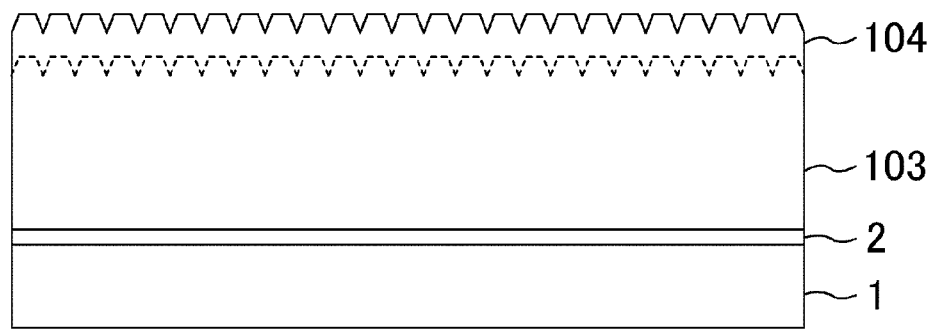
FIG. 1 is a schematic cross-sectional view illustrating a semiconductor multilayer structure according to a first exemplary embodiment of the present disclosure.

A first exemplary embodiment of the present disclosure will be described. FIG. 1 is a cross-sectional view of a semiconductor multilayer structure according to the first exemplary embodiment.

In the semiconductor multilayer structure according to the first exemplary embodiment, a buffer layer 2 made of AlN and a first nitride semiconductor layer 103 made of undoped GaN are formed in this order on a Si substrate 1 having the (111) plane as a principle surface using the C-plane (0001) as a growth surface. A second nitride semiconductor layer 104 made of p-type GaN is formed on the first nitride semiconductor layer.

The first nitride semiconductor layer 103 has unevenness, and the second nitride semiconductor layer 104 is formed to be in contact with the unevenness. At least a part of a sidewall of the unevenness of the first nitride semiconductor layer 103 includes a nitrogen polarity surface, for example, the (1-101) plane. Carbon (C) is implanted into the second nitride semiconductor layer 104 as p-type impurities, the second nitride semiconductor layer 104 located directly on the side wall of the unevenness has a p-type carrier concentration of $1 \times 10^{18}/cm^3$ or more.

Figure 11:
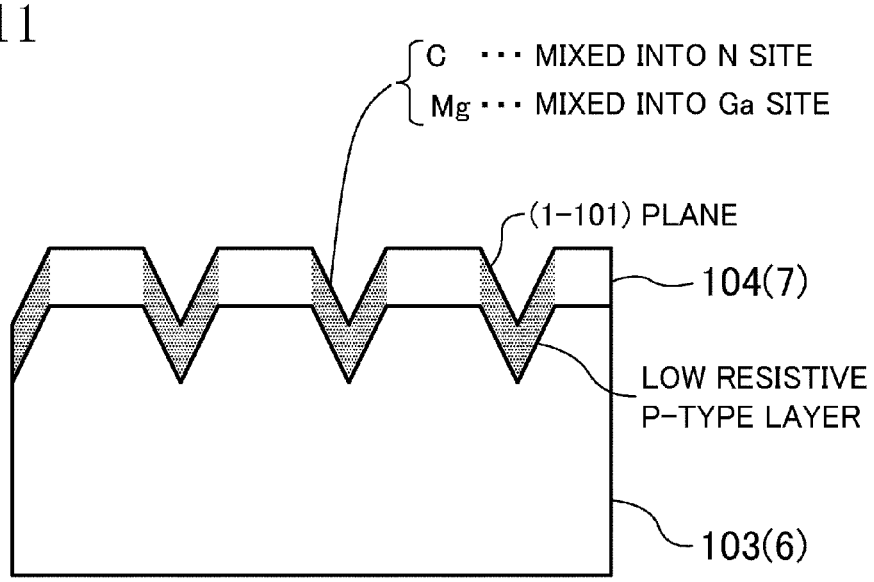
FIG. 11 is a schematic view illustrating reduction in resistivity of a p-type nitride semiconductor layer according to the first exemplary embodiment.
Figure 12:
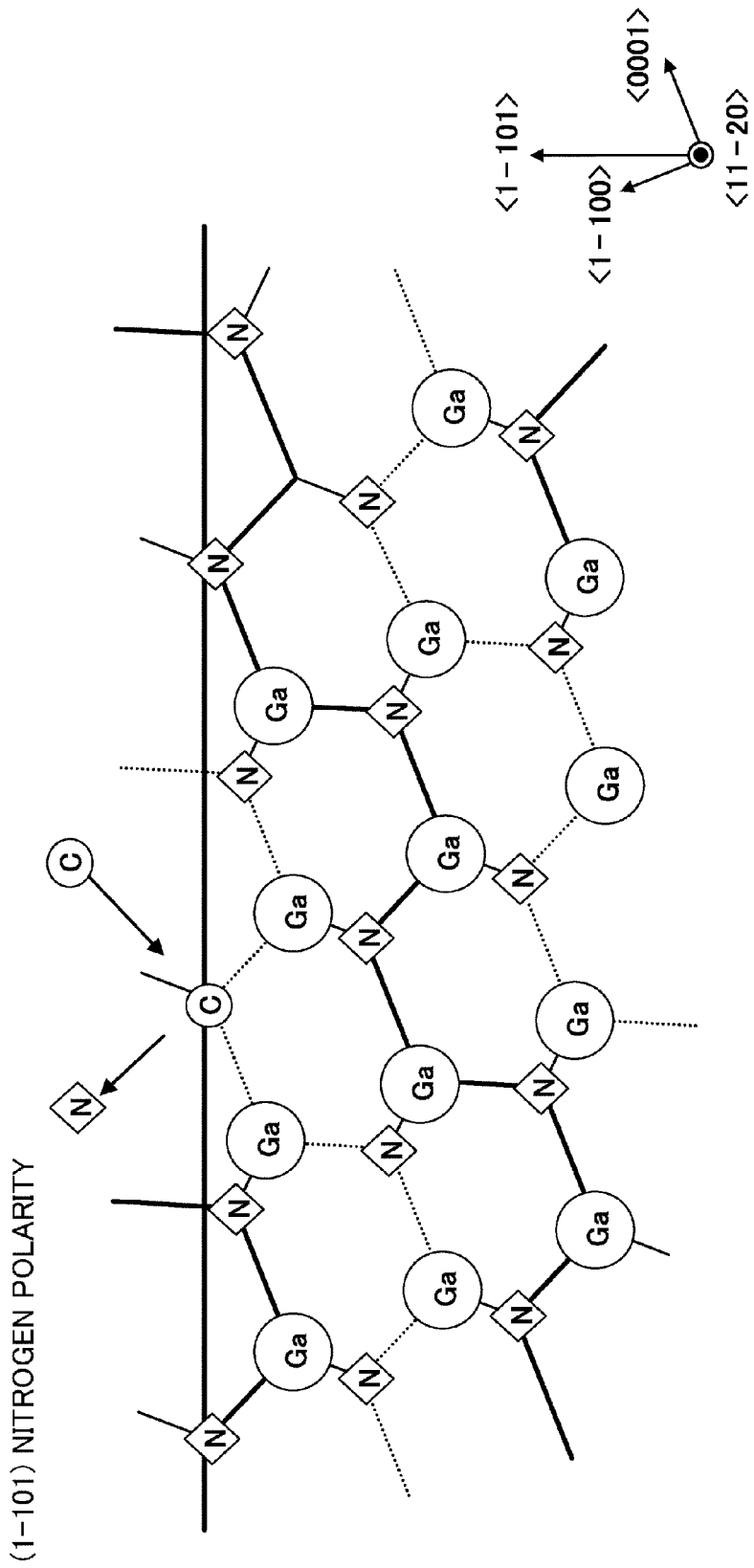
FIG. 12 is a schematic cross-sectional view illustrating the (1-101) plane viewed from the A plane (11-20).

In the semiconductor multilayer structure of this exemplary embodiment, a second p-type nitride semiconductor layer 2 is formed on the (1-101) plane, which is a nitrogen polarity surface, and is implanted with C. Thus, as shown in FIG. 11, the second nitride semiconductor layer 104 grown on the (1-101) plane has p-type conductivity with low resistivity. As shown in FIG. 12, the (1-101) plane is a nitrogen polarity surface, which is a lattice surface terminated with nitrogen. Substitution of C elements and N elements tends to occur as compared to the surface of the C-plane (0001) with Ga polarity. Thus, the C elements can be implanted at a high concentration. As long as the growth surface of the second nitride semiconductor layer 104 has nitrogen polarity, the side surface of the unevenness is not limited to the (1-101) plane, and the C elements can be implanted at a high concentration even with other plane orientation such as the (11-22) plane. Also, the substrate 1 may be made of GaN, and a nitrogen polarity surface of the GaN substrate (the back surface of a conventional substrate) may be used.

Since C is implanted into the second nitride semiconductor layer grown on the side surface of the unevenness at a high concentration, it can be seen that the C elements are distributed along the form of the unevenness at the interface between the first nitride semiconductor layer 103 and the second nitride semiconductor layer 104.

In this exemplary embodiment, the elements implanted into the second nitride semiconductor layer are not limited to C, and at least one of the group IIA or IIB elements such as Mg, Zn, Ca, or Be in the periodic table may be further implanted. This forms a more excellent p-type layer when the uneven surface includes the C-plane (0001). The elements such as Mg, Zn, Ca, and Be are stabilized in the lattice of the group III site, and C is stabilized in the lattice of the group V site. Therefore, the C elements and the elements such as Mg, Zn, Ca, and Be can be implanted at the same time.

While in this exemplary embodiment, the substrate 1 is made of silicon (Si), the material is not limited thereto and may be sapphire, GaN, SiC, GaAs, or the like. Also, substrates of various conductivity types such as non-conductive substrates, high resistive substrates, p-type substrates, and n-type substrates, as well as substrates partially having these conductivity types may be used. This is applicable to the other exemplary embodiments described below.

While in this exemplary embodiment, the buffer layer 2 is made of AlN, the material is not limited thereto, and no buffer layer may be provided depending on the material of a substrate. As the composition, the buffer layer 2 is preferably made of $Al_aGa_{1-a}N$, where $0<a\leq1$, and more preferably made of AlN. The functional role of the AlN layer is to prevent abnormal growth due to reaction of Si and Ga. A significant problem of growing GaN on a Si substrate is melt-back etching. At the initial stage of the growth, Ga and Si form an alloy at a high temperature to cause etching reaction which is so strong to break the Si substrate and the GaN layer. Thus, an AlN layer with a certain thickness is needed. The AlN layer with a thickness ranging from 5 nm to 1000 nm is most preferable in view of an improvement in crystallinity and growth time. The thickness of the buffer layer is more preferably 20 nm or more to sufficiently reduce melt-back etching due to the reaction of Si and Ga. Another problem of growing nitride semiconductor on a Si substrate is cracks caused by a difference in thermal coefficient of expansion or in lattice constant. The percentages of lattice mismatch between the (111) plane of the Si substrate and the a-axis of the C-plane (0001) of the nitride semiconductor is about 20.4% with GaN, and about 23.4% with AlN. Furthermore, the difference in thermal coefficient of expansion applies tensile stress to the nitride semiconductor layer. Thus, when a superlattice structure of AlN and $Al_aGa_{1-a}N$, where $0\leq a<1$, is inserted as another buffer layer between the substrate 1 and the buffer layer 2 or between the substrate 1 and the first nitride semiconductor layer 103, stress caused by the difference in thermal coefficient of expansion or in lattice constant can be mitigated to reduce cracks. The other buffer layer preferably has a periodic structure of AlN and GaN. In view of reduction in cracks and growth time, the number of periods preferably ranges from 10 to 200. Preferably, 50 or more periods are needed. Furthermore, Si is doped into the other buffer layer so that the other buffer layer functions as an n-type layer. The thicknesses of AlN and GaN range from 1 nm to 10 nm and from 10 nm to 50 nm, respectively. In particular, AlN is semi-insulating, and the thickness is thus determined to utilize a tunnel effect. This is applicable to the other exemplary embodiments described below.

While in this exemplary embodiment, the first nitride semiconductor layer is undoped, it may have n-type or p-type conductivity.

The semiconductor multilayer structure including the above-described low-resistive p-type semiconductor layer is applicable to various semiconductor devices such as light-emitting devices and electronic devices.

Manufacturing Method of First Exemplary Embodiment

A manufacturing method of the LED of FIG. 1 will be described below. FIGS. 2A-2E illustrate the manufacturing method of the LED according to the first exemplary embodiment of the present disclosure.

A vapor deposition system such as metal-organic chemical vapor deposition (MOCVD), thermal CVD, halide vapor phase epitaxy (HDVPE), molecular beam epitaxy (MBE), or metal-organic molecular beam epitaxy (MOMBE) is used for crystal growth of the nitride semiconductor.

Figure 2A:
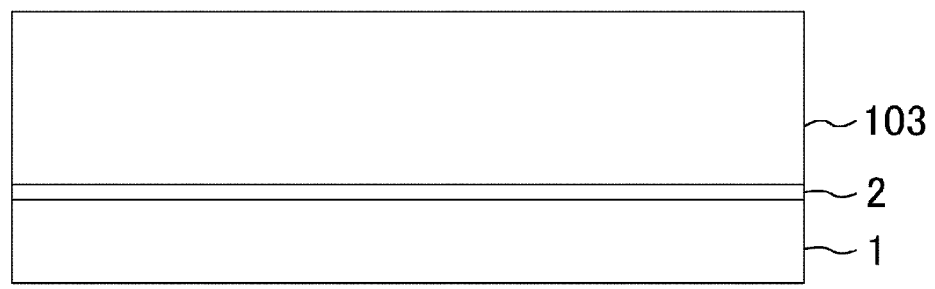
FIG. 2A is a schematic cross-sectional view illustrating a step of a manufacturing method of the semiconductor multilayer structure according to the first exemplary embodiment.

First, as shown in FIG. 2A, the buffer layer 2 made of AlN and the first nitride semiconductor layer 103 made of undoped GaN are formed in this order on the Si substrate 1 having the (111) plane as a principle surface, using the C-plane (0001) as a principle surface.

Figure 2B:
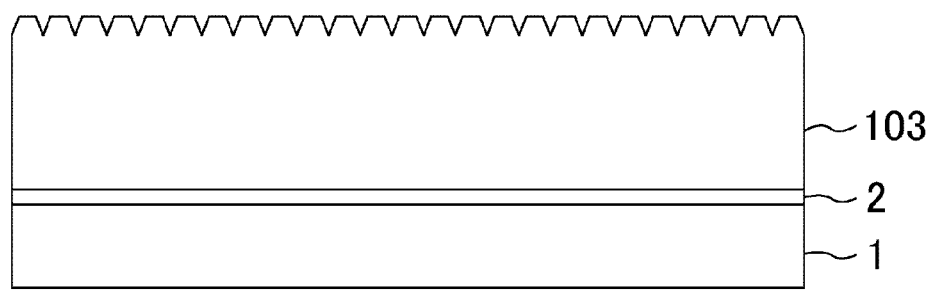
FIG. 2B is a schematic cross-sectional view illustrating a step of the manufacturing method of the semiconductor multilayer structure according to the first exemplary embodiment.

Next, as shown in FIG. 2B, unevenness is formed on the surface of the first nitride semiconductor layer 103. The unevenness is formed by, for example, crystal growth shown in FIG. 2D. Pit growth is performed by utilizing edge dislocation. At this time, recesses of the unevenness are formed on the edge dislocation. The pit growth can be controlled by the growth temperature or the growth rate of the first nitride semiconductor layer 103. The growth temperature of GaN for pit growth preferably ranges from 500° C. to 900° C. Since a low growth temperature causes reduction in crystallinity, the temperature more preferably ranges from 800° C. to 900° C. When the growth is controlled by the growth rate, the growth rate preferably ranges from 1 μm/h to 6 μm/h, and more preferably from 4 μm/h to 6 μm/h. FIG. 2E is a perspective view of a SEM image showing a result of actual formation.

The plane orientation of a sidewall of the unevenness of the first nitride semiconductor layer 103 is the (1-101) plane.

Figure 2C:
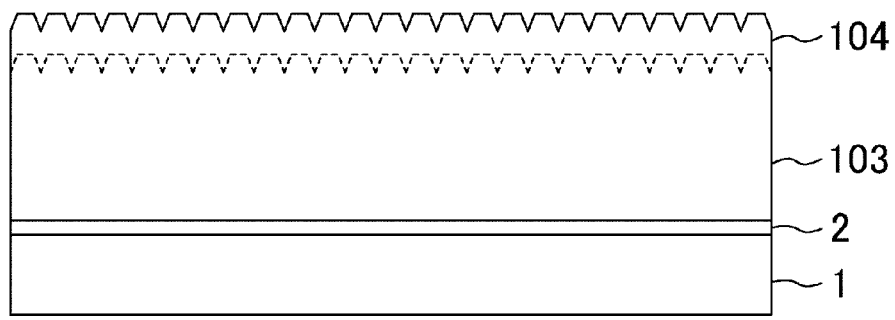
FIG. 2C is a schematic cross-sectional view illustrating a step of the manufacturing method of the semiconductor multilayer structure according to the first exemplary embodiment.
Figure 2D:
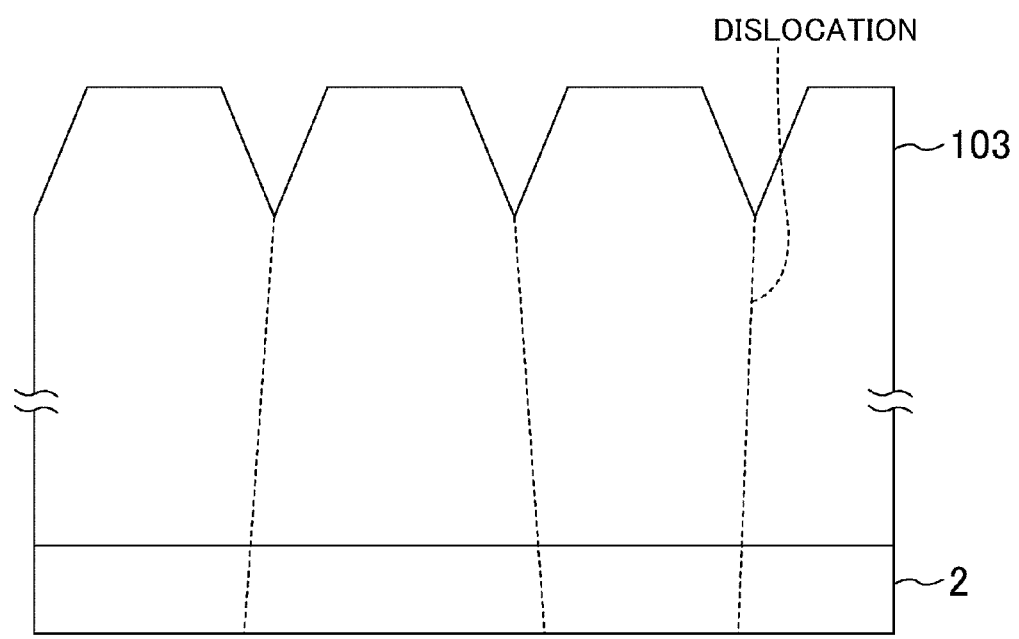
FIG. 2D is a schematic cross-sectional view illustrating a step of the manufacturing method of the semiconductor multilayer structure according to the first exemplary embodiment.
Figure 2E:
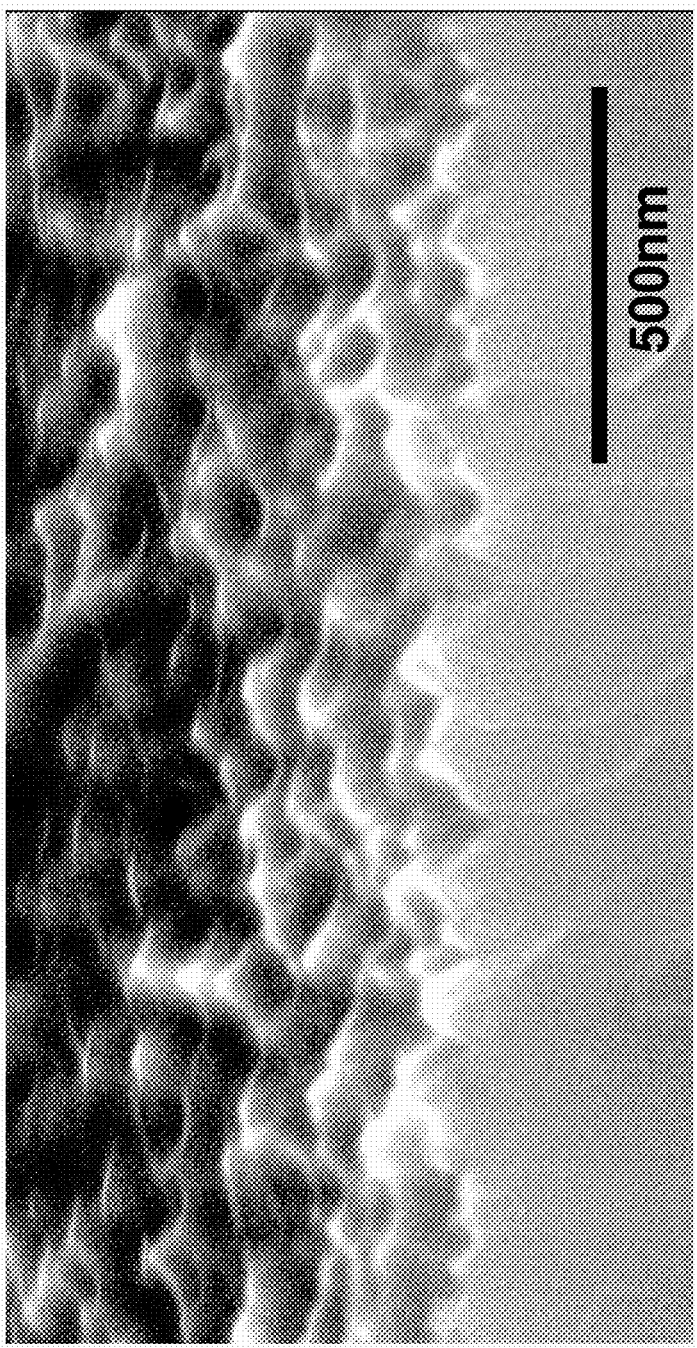
FIG. 2E is a perspective view of a SEM image during a process of the manufacturing method of the semiconductor multilayer structure according to the first exemplary embodiment.

Next, as shown in FIG. 2C, the second nitride semiconductor layer 104 made of GaN and implanted with carbon (C) as p-type impurities is formed to be in contact with the side surface of the unevenness of the first nitride semiconductor layer 103. As implantation methods of C, there are artificial implantation and natural implantation. In the artificial implantation, a gas material of hydrocarbon such as $C_2H_2$, $C_2H_4$, or $CH_4$, or a gas material of halomethane such as $CCl_4$, $CHCl_3$, $CI_4$ or $CBr_4$ is used during the growth of the (1-101) plane of the second nitride semiconductor layer 7. Natural implantation of C can be performed by reducing a V/III ratio using metal organic for the group III material or lowering the growth temperature. The group III material is preferably trimethylgallium (TMG), trimethylaluminum (TMA), or trimethylindium (TMI). While the group V material is preferably $NH_3$, the amount of naturally implanted C increases when using nitride as an organic compound such as dimethylhydrazine (DMHy) alone or in a mixture with $NH_3$. Then, unevenness is formed on the surface of the second nitride semiconductor layer 104 reflecting the unevenness of the first nitride semiconductor layer 103.

According to the above-described method, the second nitride semiconductor layer 104 located directly on a sidewall of the unevenness has a p-type carrier concentration of $1 \times 10^{18}/cm^3$ or more, a semiconductor layer having p-type conductivity with low resistivity can be obtained.

Second Exemplary Embodiment

Figure 3:
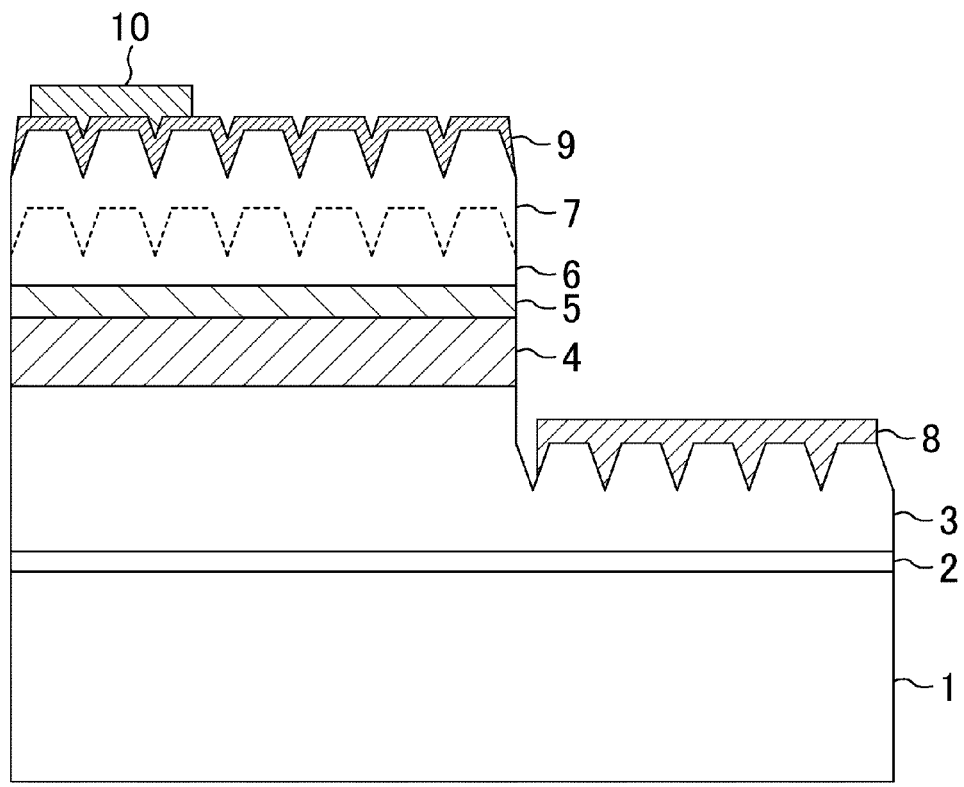
FIG. 3 is a schematic cross-sectional view illustrating a light-emitting device according to a second exemplary embodiment.

A second exemplary embodiment of the present disclosure will be described below. FIG. 3 is a cross-sectional view of an LED according to the second exemplary embodiment.

In the nitride semiconductor light-emitting device of the second exemplary embodiment, the buffer layer 2 made of AlN, an n-type nitride semiconductor layer 3 made of n-type GaN, a light-emitting layer 4, an overflow suppression layer (hereinafter referred to as an "OFS layer") 5 made of p-type AlGaN, and a first p-type nitride semiconductor layer 6 made of p-type GaN are formed in this order on the Si substrate 1 having the (111) plane as a principle surface, using the C-plane (0001) as a principle surface. A second p-type nitride semiconductor layer 7 made of p-type GaN is formed on the first p-type nitride semiconductor layer 6. A negative electrode 8 is formed on an exposed region of the n-type nitride semiconductor layer 3 after removing parts of the light-emitting layer 4, the OFS layer 5, the first p-type nitride semiconductor layer 6, and the second p-type nitride semiconductor layer 7. Also, a positive electrode 9 is formed on the second p-type nitride semiconductor layer 7. A pad electrode 10 is formed on the positive electrode 9. The light-emitting layer 4 has a multiple quantum well structure formed by alternately stacking barrier layers of GaN and well layers of $In_bGa_{1-b}N$, where 0<b<1. The negative electrode 8 is a multilayer film formed by sequentially staking Ti/Al/Ni/Au. The positive electrode 9 is made of indium tin oxide (ITO). The pad electrode 10 is made of Ti/Al/Ni/Au.

In this exemplary embodiment, the first p-type nitride semiconductor layer 6 has unevenness, and the second p-type nitride semiconductor layer 7 is formed to be in contact with the unevenness. At least a part of the side surface of the unevenness of the first p-type nitride semiconductor layer 6 includes a nitrogen polarity surface, for example, the (1-101) plane. C is implanted alone into the first p-type nitride semiconductor layer 6 as p-type impurities, or at least one of Mg, Zn, Ca, or Be is implanted in addition to C. C is implanted into the second p-type nitride semiconductor layer 7 as p-type impurities. The second p-type nitride semiconductor layer 7 located directly on a sidewall of the unevenness has a p-type carrier concentration of $1 \times 10^{18}/cm^3$ or more.

In the nitride semiconductor light-emitting device of this exemplary embodiment, the second p-type nitride semiconductor layer 7 is formed on the (1-101) plane, which is a nitrogen polarity surface, and is implanted with C. Thus, as shown in FIG. 11, the second p-type nitride semiconductor layer 7 grown on the (1-101) plane is of a p-type with low resistivity. The (1-101) plane is, as shown in FIG. 12, a nitrogen polarity surface in which a lattice surface is terminated with nitrogen, and substitution of C elements and N elements tends to occur as compared to the surface of the C-plane (0001) with Ga polarity. Thus, the C elements are implanted at a high concentration. As long as the growth surface of the second p-type nitride semiconductor layer 7 has nitrogen polarity, the side surface of the unevenness is not limited to the (1-101) plane, but C elements can be implanted at a high concentration on a surface even with other plane orientation such as the (11-22) plane. The substrate 1 may be made of GaN, and a nitrogen polarity surface of the GaN substrate (the back surface of a conventional substrate) may be used.

Since C is implanted at a high concentration into the second p-type nitride semiconductor layer grown on the side surface of the unevenness, it can be seen that C elements are distributed along the form of the unevenness at the interface between the first p-type nitride semiconductor layer 6 and the second p-type nitride semiconductor layer 7.

In this exemplary embodiment, the elements implanted into the second p-type nitride semiconductor layer 7 are not limited to C, and at least one of the group IIA and IIB elements such as Mg, Zn, Ca, or Be in the periodic table may be further implanted. This forms a more excellent p-type layer when the uneven surface includes the C-plane (0001), thereby lowering a forward voltage (Vf). The elements such as Mg, Zn, Ca, and Be are stabilized in the lattice of the group III site, and C is stabilized in the lattice of the group V site. Therefore, the C elements and the elements such as Mg, Zn, Ca, and Be can be implemented at the same time.

Figure 5:
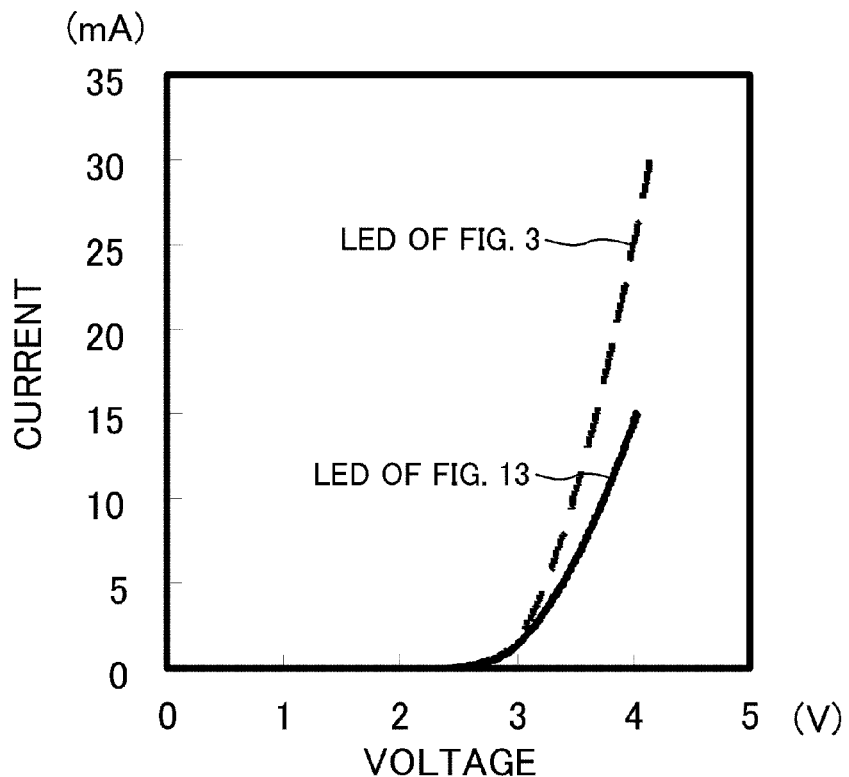
FIG. 5 is a comparison graph of I-V characteristics between the light-emitting device according to the second exemplary embodiment and a conventional light-emitting device.
Figure 13:
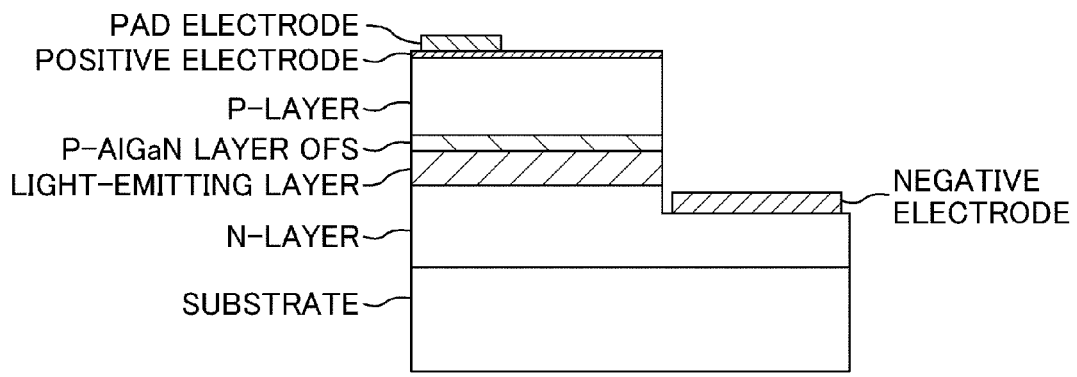
FIG. 13 is a schematic cross-sectional view illustrating a light-emitting device with a conventional structure.

The I-V characteristics of the LED of this exemplary embodiment is compared to those of the conventional LED shown in FIG. 13. FIG. 5 illustrates the comparison result of the I-V characteristics. When the LED of this exemplary embodiment and the conventional LED are driven with 20 mA, the driving voltages are 3.7 V and 3.9 V, respectively. It is found that the driving voltage is reduced by 0.2 V at the driving current of 20 mA.

While in this exemplary embodiment, the n-type nitride semiconductor layer 3 is a single layer of GaN, the structure is not limited thereto and may be a single layer or a multilayer. In order to obtain a nitride semiconductor layer with fewer crystal defects, the n-type nitride semiconductor layer 3 is preferably made of GaN or $Al_xIn_yGa_{1-x-y}N$, where 0≦x<1 and 0≦y<1, with alloy crystal ratios x and y of 0.2 or less.

The n-type nitride semiconductor layer 3 preferably has a thickness raging from 0.1 μm to 10 μm in view of cracks or growth time. In particular, when a layer is grown on a substrate of a different material such as a Si substrate, crystallinity tends to improve with an increase in the thickness. When a nitride semiconductor layer is grown on a Si substrate, cracks are difficult to occur in a light-emitting device by reducing the thickness of the n-type nitride semiconductor layer to 3 μm or more. As a result, yields tend to improve. Si ranging from $1 \times 10^{18}$ $cm^{-3}$ to $1 \times 10^{19}$ $cm^{-3}$ is preferably implanted into the n-type nitride semiconductor layer 3. In the n-type nitride semiconductor layer 3, a single layer or a periodic structure of $In_xGa_{1-x}N$ with an alloy crystal ratio x of 0.3 or less may be inserted for the purpose of reducing stress to the light-emitting layer 4. This is applicable to the other exemplary embodiments described below.

While in this exemplary embodiment, the light-emitting layer 4 has a multiple quantum well structure made of GaN and $In_aGa_{1-a}N$, where 0<a<1, the structure is not limited thereto and may be a single quantum well structure and a multiple quantum well structure. The layer 4 may be made of $In_aGa_{1-a}N$, where 0≦a<1, which is nitride semiconductor containing In and Ga. When a multiple quantum well structure is used, the light-emitting layer includes barrier layers and well layers. The barrier layers are, for example, made of GaN and have a thickness of 10 nm. The well layers are, for example, made of $In_aGa_{1-a}N$, where 0<a<1, and have a thickness of 3 nm. Note that the thickness of the light-emitting layer as a whole is not particularly limited, and the number of the stacked barrier layers and well layers and the order of stacking are controlled to set the thickness of the light-emitting layer in view of the light-emitting wavelength, etc. In the above structure, current injection causes, for example, blue light emission ranging from 400 nm to 500 nm, particularly around 470 nm. An undoped $Al_xIn_yGa_{1-x-y}N$ layer, where 0≦x<1 and 0≦y<1, may be inserted between the light-emitting layer 4 and the p-type layer (e.g., the OFS layer) 5 implanted with Mg for the purpose of reducing diffusion of Mg into the light-emitting layer 4. This is applicable to the other exemplary embodiments described below.

While in this exemplary embodiment, the OFS layer 5 made of $Al_aGa_{1-a}N$ (0<a≦1) is inserted between the first p-type nitride semiconductor layer 6 and the light-emitting layer 4. When functionally described, overflow of electrons from the n-type nitride semiconductor layer is reduced to increase the probability of radiative recombination in the light-emitting layer. For example, when the barrier layers of the light-emitting layer are made of GaN and the well layers are made of InGaN, an Al composition of the OFS layer 5 preferably ranges from 5% to 30%, and the thickness preferably ranges from 20 nm to 100 nm in view of reducing cracks and deterioration in crystallinity caused by an increase in impurities of an Al material. Note that the OFS layer 5 is not necessarily required, and may not exist. This is applicable to the other exemplary embodiments described below.

While in this exemplary embodiment, the first p-type nitride semiconductor layer 6 and the second p-type nitride semiconductor layer 7 are the single layers of GaN, but the structures are not limited thereto and may be multiple layers. In the case of the double hetero junction in which a light-emitting layer is provided between the n-type nitride semiconductor layer and the p-type nitride semiconductor layer, at least a p-type nitride semiconductor layer having greater band gap energy than light-emitting energy (a light-emitting wavelength) of the light-emitting layer suffices as a p-side cladding layer. As the composition, the p-type nitride semiconductor layers 6 and 7 are preferably made of nitride semiconductor of ternary alloy crystal, and more preferably nitride semiconductor of GaN which is binary alloy crystal not containing In or Al. This forms excellent ohmic contact with the positive electrode 9 and improves luminous efficiency. This is applicable to the other exemplary embodiments described below.

While in this exemplary embodiment, the negative electrode 8 is made of a multilayer film formed by sequentially stacking Ti/Al/Ni/Au, the material may be a metal, an alloy, and a multilayer structure containing at least one selected from the group consisting of Ti, Zr, W, Al, Ni, and Au, and a compound of these materials. This is applicable to the other exemplary embodiments described below.

While in this exemplary embodiment, the positive electrode 9 is made of ITO, a positive electrode for a p-type nitride semiconductor layer may be made of a metal, an alloy, and a multilayer structure containing at least one selected from the group consisting of Ni, Pt, Pd, Rh, Ru, Os, Ir, Ti, Zr, Hf, V, Nb, Ta, Co, Fe, Mn, Mo, Cr, W, La, Cu, Ag, and Y, and a compound of these materials, for example, conductive oxide. The conductive metal oxide (oxide semiconductor) is, for example, indium tin oxide (ITO), ZnO, $In_2O_3$, or $SnO_2$ doped with tin and having a thickness ranging from 5 nm to 10 μm, or doped with a group III element such as Ga of nitride semiconductor. These materials are preferable for a translucent electrode. This is applicable to the other exemplary embodiments described below.

In this exemplary embodiment, the second nitride semiconductor layer 104 located directly on the sidewall of the unevenness has a p-type carrier concentration of $1 \times 10^{18}/cm^3$ or more. According to the present disclosure, a p-type carrier concentration can be increased, and is preferably $1 \times 10^{19}/cm^3$ or more. This is applicable to the other exemplary embodiments described below.

Manufacturing Method of Second Exemplary Embodiment

A manufacturing method of the LED of FIG. 3 will be described. FIGS. 4A-4G illustrate the manufacturing method of the LED according to the second exemplary embodiment.

A vapor deposition system such as metal-organic chemical vapor deposition (MOCVD), thermal CVD, halide vapor phase epitaxy (HDVPE), molecular beam epitaxy (MBE), or metal-organic molecular beam epitaxy (MOMBE) is used for crystal growth of the nitride semiconductor.

Figure 4A:
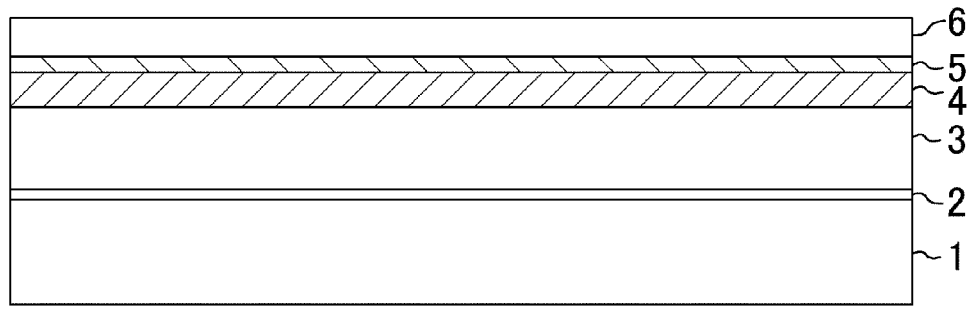
FIG. 4A is a schematic cross-sectional view illustrating a step of a manufacturing method of the light-emitting device according to the second exemplary embodiment.

First, as shown in FIG. 4A, the buffer layer 2 made of AlN, the n-type nitride semiconductor layer 3 made of n-type GaN, the light-emitting layer 4, the overflow suppression layer (hereinafter referred to as "OFS layer") 5 made of p-type AlGaN, and the first p-type nitride semiconductor layer 6 made of p-type GaN are formed in this order on the Si substrate 1 having the (111) plane as a principle surface, using the C-plane (0001) as a principle surface.

Figure 4B:
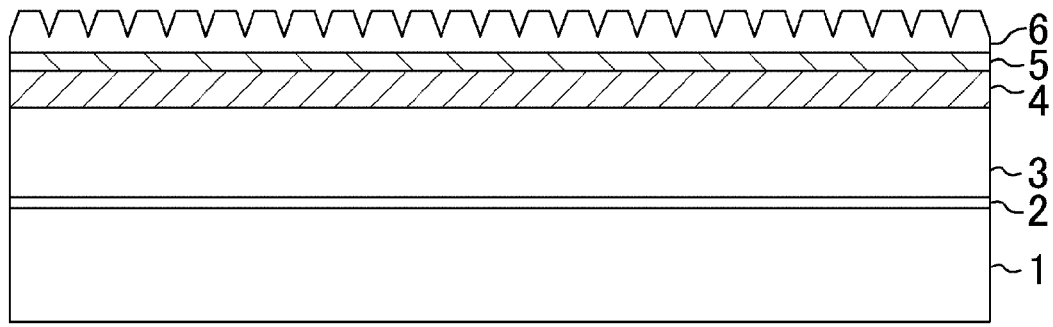
FIG. 4B is a schematic cross-sectional view illustrating a step of the manufacturing method of the light-emitting device according to the second exemplary embodiment.

Next, as shown in FIG. 4B, unevenness is formed on the surface of the first p-type nitride semiconductor layer 6. The unevenness is formed by, for example, crystal growth shown in FIG. 4G. Pit growth is performed by utilizing edge dislocation. At this time, recesses of the unevenness are formed on the edge dislocation. The pit growth can be controlled by the growth temperature or the growth rate of the first p-type nitride semiconductor layer 6. The growth temperature of GaN for pit growth preferably ranges from 500° C. to 900° C. Since a low growth temperature causes reduction in crystallinity, the temperature more preferably ranges from 800° C. to 900° C. When the growth is controlled by the growth rate, the growth rate preferably ranges from 1 μm/h to 6 μm/h, and more preferably from 4 μm/h to 6 μm/h. The plane orientation of a sidewall of the unevenness of the first p-type nitride semiconductor layer 6 is the (1-101) plane.

Figure 4C:
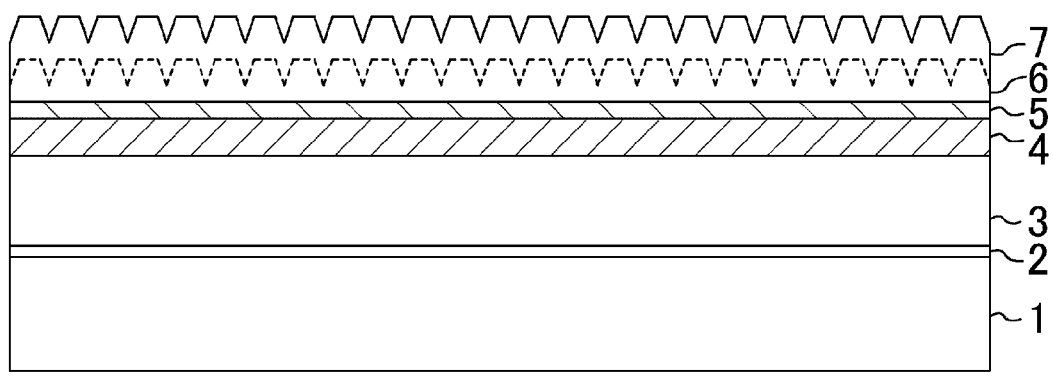
FIG. 4C is a schematic cross-sectional view illustrating a step of the manufacturing method of the light-emitting device according to the second exemplary embodiment.

Then, as shown in FIG. 4C, the second p-type nitride semiconductor layer 7 made of p-type GaN and implanted with C as p-type impurities is formed to be in contact with the side surface of the unevenness of the first p-type nitride semiconductor layer 6. As implantation methods of C, there are artificial implantation and natural implantation. In the artificial implantation, a gas material of hydrocarbon such as $C_2H_2$, $C_2H_4$, or $CH_4$, or a gas material of halomethane such as $CCl_4$, $CHCl_3$, $Cl_4$ or $CBr_4$ is used during the growth of the (1-101) plane of the second nitride semiconductor layer 7. Natural implantation of C can be performed by reducing a V/III ratio using metal organic for the group III material or lowering the growth temperature. The group III material is preferably trimethylgallium (TMG), trimethylaluminum (TMA), or trimethylindium (TMI). While the group V material is preferably $NH_3$, the amount of naturally implanted C increases when using nitride as an organic compound such as dimethylhydrazine (DMHy) alone or in a mixture with $NH_3$. Then, unevenness is formed on the surface of the second p-type nitride semiconductor layer 7 reflecting the unevenness of the first p-type nitride semiconductor layer 6.

Figure 4D:
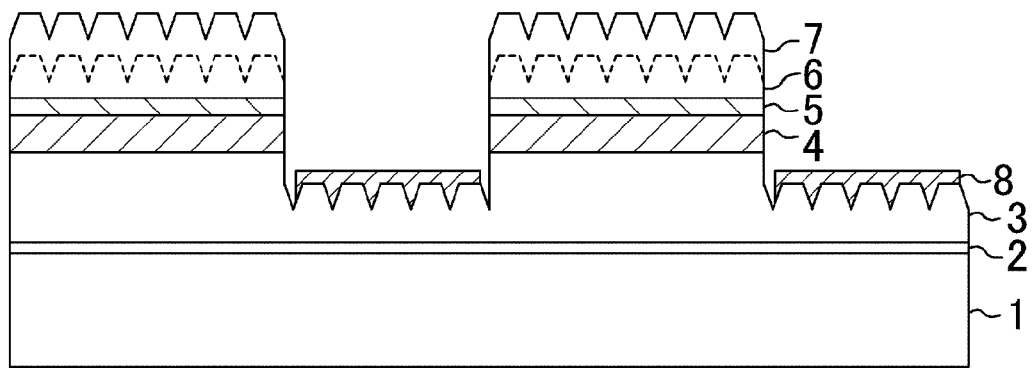
FIG. 4D is a schematic cross-sectional view illustrating a step of the manufacturing method of the light-emitting device according to the second exemplary embodiment.

After that, as shown in FIG. 4D, parts of the second p-type nitride semiconductor layer 7, the first p-type nitride semiconductor layer 6, the OFS layer 5, and the light-emitting layer 4 are removed to expose a part of the n-type nitride semiconductor layer 3. In order to form a structure in which a part of the n-type nitride semiconductor layer 3 is exposed while retaining the unevenness structure on the second p-type nitride semiconductor layer 7, for example, a resist or a Ni metal film (not shown) is selectively formed in, for example, a square ranging from 5 μm to 100 μm per side. Using the resist or the Ni metal film as a mask, dry etching called "inductively coupled plasma (ICP) etching" with $Cl_2$ gas is performed, thereby selectively removing parts of the second p-type nitride semiconductor layer 7, the first p-type nitride semiconductor layer 6, the OFS layer 5, and the light-emitting layer 4. Furthermore, the negative electrode 8 formed by sequentially stacking Ti/Al/Ni/Au is selectively provided on the exposed surface of the n-type nitride semiconductor layer 3 by, for example, electron beam deposition and lift-off. In order to reduce contact resistance of the negative electrode 8, sintering may be performed, for example, in an $N_2$ atmosphere at the temperature of 550° C.

Figure 4E:
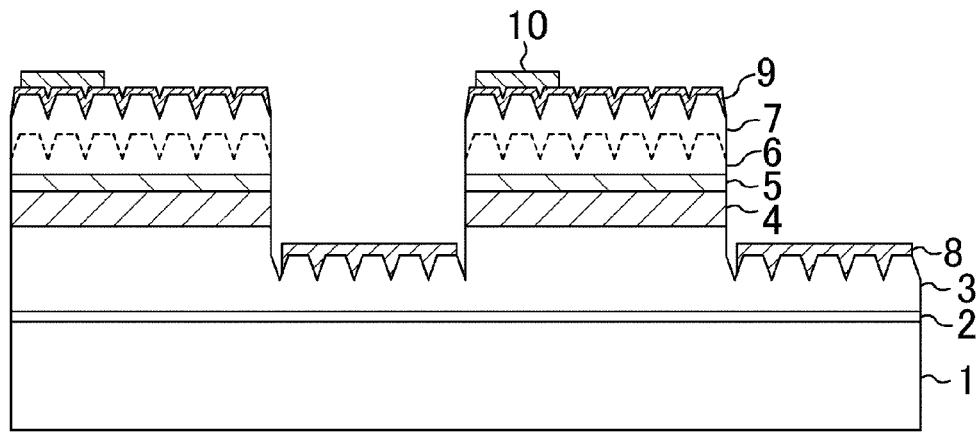
FIG. 4E is a schematic cross-sectional view illustrating a step of the manufacturing method of the light-emitting device according to the second exemplary embodiment.

Then, as shown in FIG. 4E, the positive electrode 9 made of ITO is formed along the (1-101) plane of the unevenness of the second p-type nitride semiconductor layer 7, and the pad electrode 10 for wire bonding made of Ti/Al/Ni/Au is provided on the positive electrode 9.

Figure 4F:
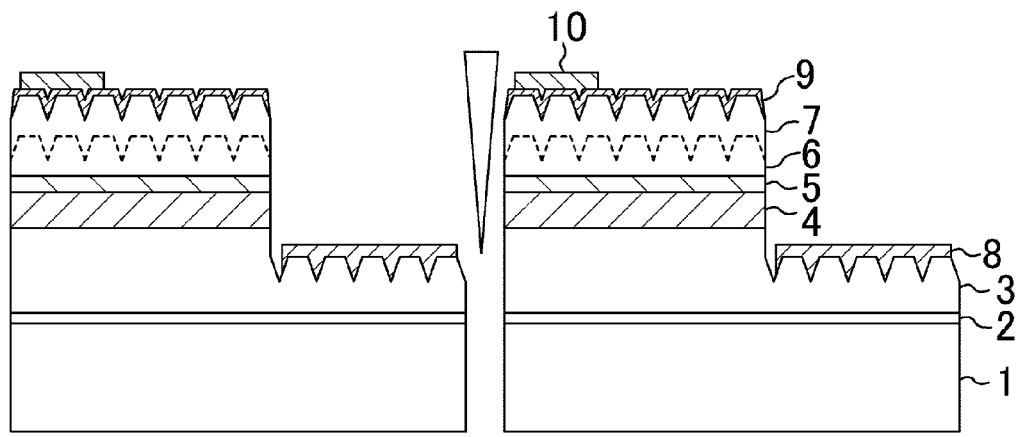
FIG. 4F is a schematic cross-sectional view illustrating a step of the manufacturing method of the light-emitting device according to the second exemplary embodiment.

After the formation of the electrode, as shown in FIG. 4F, the wafer is divided into light-emitting diode chips with a chip size ranging 250 μm to 1000 μm per side by, for example, dicing. These chips are mounted on, for example, a suitable supporting substrate with plated bumps, mounted on a package surface using Ag paste, is then applied with, for example, YAG phosphor, and encapsulated in a cannonball-like form with a resin.

First Variation of Second Exemplary Embodiment

Figure 6:
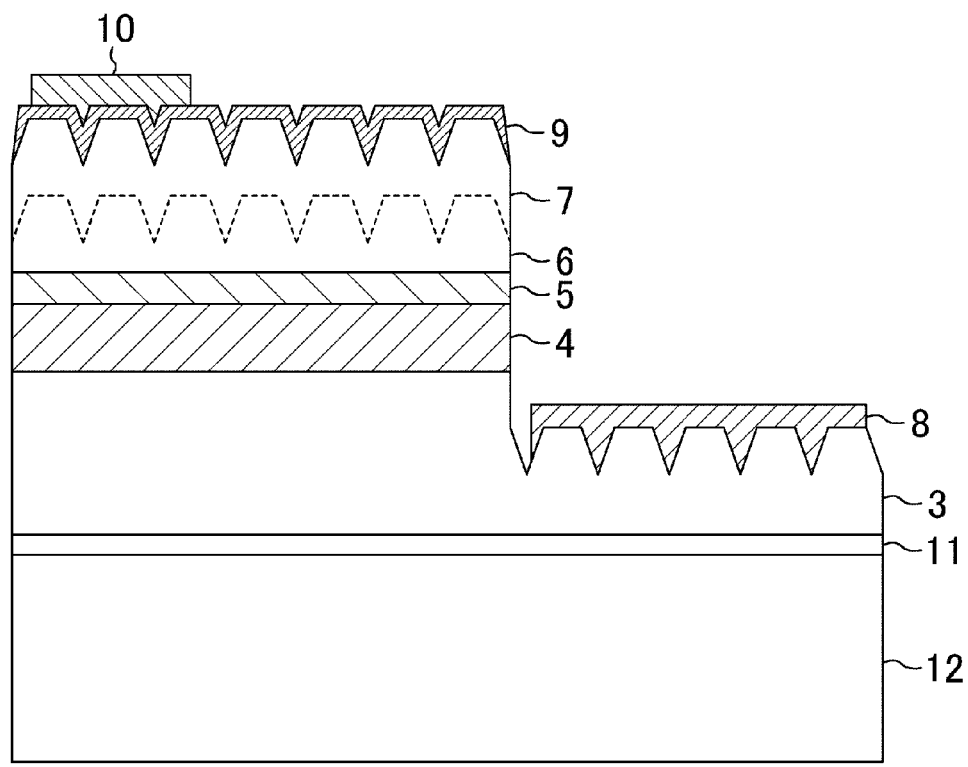
FIG. 6 is a schematic cross-sectional view illustrating a light-emitting device according to a first variation of the second exemplary embodiment.

A first variation of the second exemplary embodiment of the present disclosure will be described below. FIG. 6 is a cross-sectional view of an LED according to the first variation of the second exemplary embodiment. The same reference characters as those shown in the second exemplary embodiment are used to represent equivalent elements, and the explanation thereof will be omitted.

In this variation, the substrate 1 is removed, and a reflective film 11 formed by sequentially stacking Al/Ti/Cu is provided on the exposed surface of the n-type nitride semiconductor layer 3. A metal film 12 made of Cu is provided on the reflective film 11. With this structure, light irradiated from the light-emitting layer 4 to the n-type semiconductor layer is reflected by the reflective film 11, and extracted from the p-type layer, thereby improving luminous efficiency. The metal film 12 improves heat dissipation characteristics. The metal film 12 preferably has a thickness of 10 μm or more.

Manufacturing Method of First Variation of Second Exemplary Embodiment

According to a manufacturing method of the first variation of the second exemplary embodiment, a supporting substrate 13 made of, e.g., Si is bonded to the second p-type nitride semiconductor layer, after the formation of the positive electrode 9 is finished in the manufacturing method of the second exemplary embodiment. Then, the substrate 1 is removed by wet etching (with a mixture of fluoric acid and nitric acid) or gas etching ($Cl_2$). A multilayer film of Al/Ti/Cu is deposited as the reflective film 11 on the exposed n-type nitride semiconductor layer 3. Cu is formed as the metal film 12 by plating. The supporting substrate 13 used for bonding is removed. Then, an electrode pad 10 is formed on the positive electrode 9. As a result, the LED is manufactured.

Second Variation of Second Exemplary Embodiment

Figure 7:
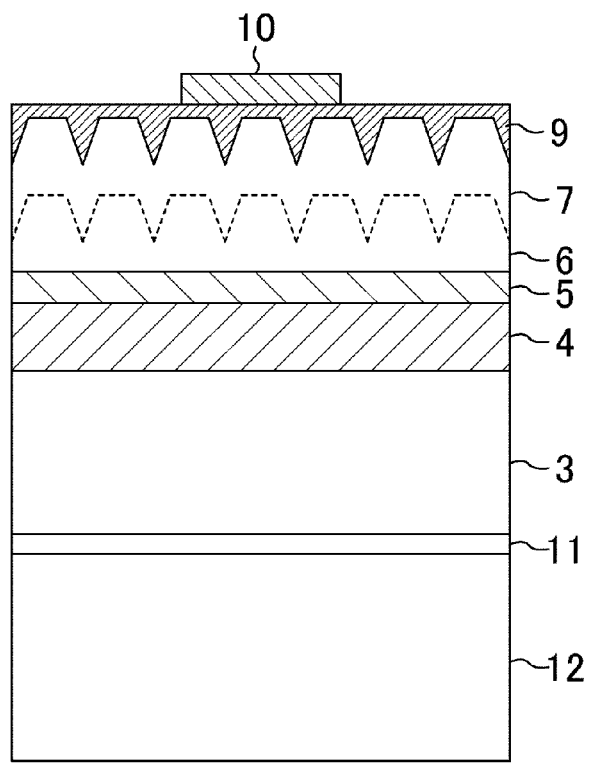
FIG. 7 is a schematic cross-sectional view illustrating a light-emitting device according to a second variation of the second exemplary embodiment.

A second variation of the second exemplary embodiment of the present disclosure will be described below. While the LED shown in FIG. 3 has a so-called horizontal structure, the structure is not limited thereto and may be of a vertical type. FIG. 7 is a cross-sectional view of a vertical LED according to the second variation of the second exemplary embodiment. The same reference characters as those shown in the second exemplary embodiment are used to represent equivalent elements, and the explanation thereof will be omitted.

Differences from the second exemplary embodiment are as follows. In the second exemplary embodiment, parts of the second p-type nitride semiconductor layer 7, the first p-type nitride semiconductor layer 6, the OFS layer 5, and the light-emitting layer 4 are removed, and the negative electrode 8 is formed on the exposed surface of the n-type nitride semiconductor layer 3. On the other hand, the Si substrate 1 is removed in this variation. The reflective film 11 formed by sequentially stacking Al/Ti/Cu is provided on the exposed surface of the n-type nitride semiconductor layer 3. The metal film 12 made of Cu is provided on the reflective film 11. The negative electrode 8 is omitted. A current flows between the positive electrode 9 and the metal film 12 in a vertical direction, thereby reducing series resistance. The advantages of improving luminous efficiency of the reflective film 11, and improving heat dissipation characteristics of the metal film 12 are similar to those described in the first variation.

Manufacturing Method of Second Variation of Second Exemplary Embodiment

According to a manufacturing method of the second variation of the second exemplary embodiment, the positive electrode 9 is formed on the second p-type nitride semiconductor layer 7, after the formation of the second p-type nitride semiconductor layer 7 is finished in the manufacturing method of the second exemplary embodiment. Then, similar to the first variation, bonding of the supporting substrate 13, removal of the substrate 1, formation of the reflective film 11, formation of the metal film 12, and removal of the supporting substrate 13 are sequentially performed. Then, the electrode pad 10 is formed on the positive electrode 9, thereby forming the LED.

Third Exemplary Embodiment

Figure 8:
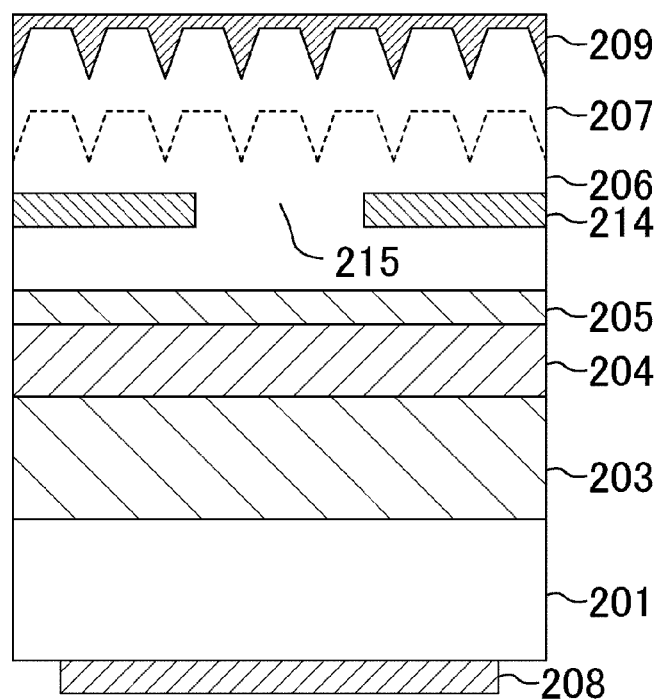
FIG. 8 is a cross-sectional view of a light-emitting device according to a third exemplary embodiment.

A third exemplary embodiment will be described. While the LED has been described in the second exemplary embodiment, the p-type nitride semiconductor layer of the present disclosure is applicable to a laser diode (hereinafter referred to as an "LD"). FIG. 8 is a cross-sectional view of a laser diode according to the third exemplary embodiment of the present disclosure.

In the nitride semiconductor light-emitting device of the third exemplary embodiment, an n-type nitride semiconductor layer 203 made of n-type $Al_aGa_{1-a}N$, where $0 \leq a < 1$, a light-emitting layer 204, an OFS layer 205 made of p-type AlGaN, the first p-type nitride semiconductor layer 206 made of p-type $Al_aGa_{1-a}N$, where $0 < a < 1$, and the second p-type nitride semiconductor layer 207 made of p-type $Al_aGa_{1-a}N$, where $0 < a < 1$, are formed in this order on a substrate 201 made of n-type and GaN having a (0001) plane as a principle surface, using the C-plane (0001) as a principle surface. In addition, a positive electrode 209 is formed on the second p-type nitride semiconductor layer 207, and a negative electrode 208 is formed on the back of the substrate 1, thereby forming a vertical structure. The light-emitting layer 4 has a multiple quantum well structure formed by alternately stacking barrier layers made of GaN and well layers made of $In_bGa_{1-b}N$, where $0 < b < 1$. A negative electrode 208 is a multilayer film formed by sequentially staking Ti/Al/Ni/Au. The positive electrode 209 is made of indium tin oxide (ITO). A current confining layer 214 controlling current diffusion into the surface and made of n-type $Al_aGa_{1-a}N$, where $0 \leq a < 1$, is inserted in the first p-type nitride semiconductor layer 206. This allows selective current flow to a current opening 215, thereby limiting a light-emitting region.

In this exemplary embodiment, the first p-type nitride semiconductor layer 206 has unevenness, and the second p-type nitride semiconductor layer 207 is formed to be in contact with the unevenness. At least a part of the side surface of the unevenness of the first p-type nitride semiconductor layer 206 includes a nitrogen polarity surface, for example, the (1-101) plane. C is implanted alone into the first p-type nitride semiconductor layer 206 as p-type impurities, or at least one of Mg, Zn, Ca, or Be is implanted in addition to C. C is implanted into the second p-type nitride semiconductor layer 207 as p-type impurities.

Since the LD is used in this exemplary embodiment, at least a layer with greater band gap energy than that of the light-emitting layer is preferably provided as a cladding layer for each of the n-type layer and the p-type layer sandwiching the light-emitting layer to strictly confine light in a waveguide. For example, each of the n-type and the p-type layer may include a layer with a composition of $Al_aGa_{1-a}N$, where $0 < a < 1$.

Fourth Exemplary Embodiment

Figure 9A:
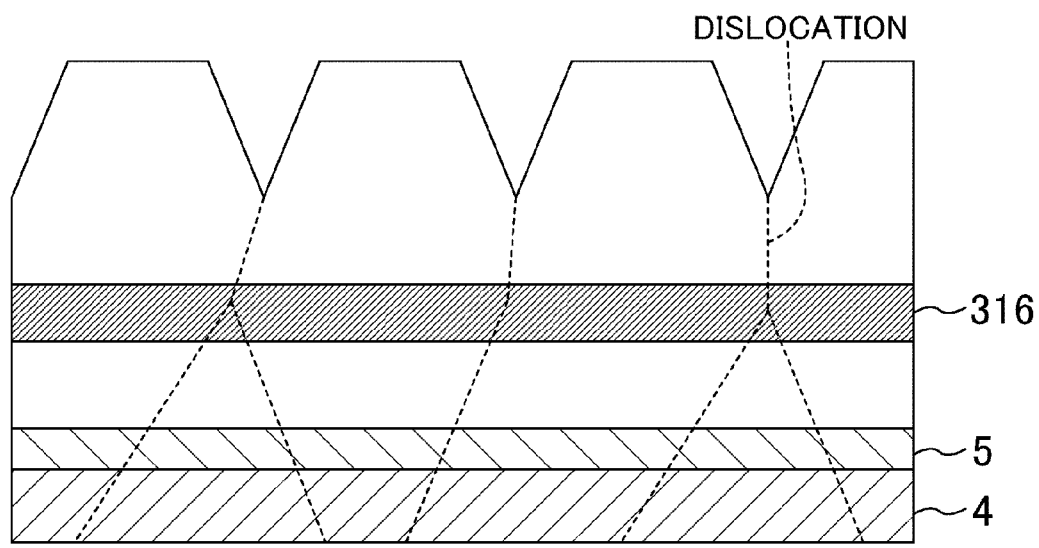
FIG. 9A is a schematic cross-sectional view illustrating a light-emitting device according to a fourth exemplary embodiment.

A light-emitting device of a fourth exemplary embodiment will be described. FIG. 9A is a cross-sectional view of the LED according to the fourth exemplary embodiment of the present disclosure, and shows a part from a light-emitting layer to a p-type layer having unevenness.

The LED of this exemplary embodiment has basically the same structure as the LED of the second exemplary embodiment. However, as shown in FIG. 9A, a periodic structure (SLs layer) 316 is inserted between the unevenness and the light-emitting layer in the first p-type semiconductor layer 6. In this respect, this exemplary embodiment differs from the first exemplary embodiment. The periodic structure 316 has a superlattice structure formed by alternately stacking GaN and $Al_aGa_{1-a}N$, where $0 \leq a < 1$. The number of the periods is 15, and the Al composition is 20%. The number of the periods and the composition are not limited thereto. Also, the structure is not limited to the structure formed by alternately stacking two types of layers, but may be a structure having multiple periods of three or more layers of different composition.

Figure 4G:
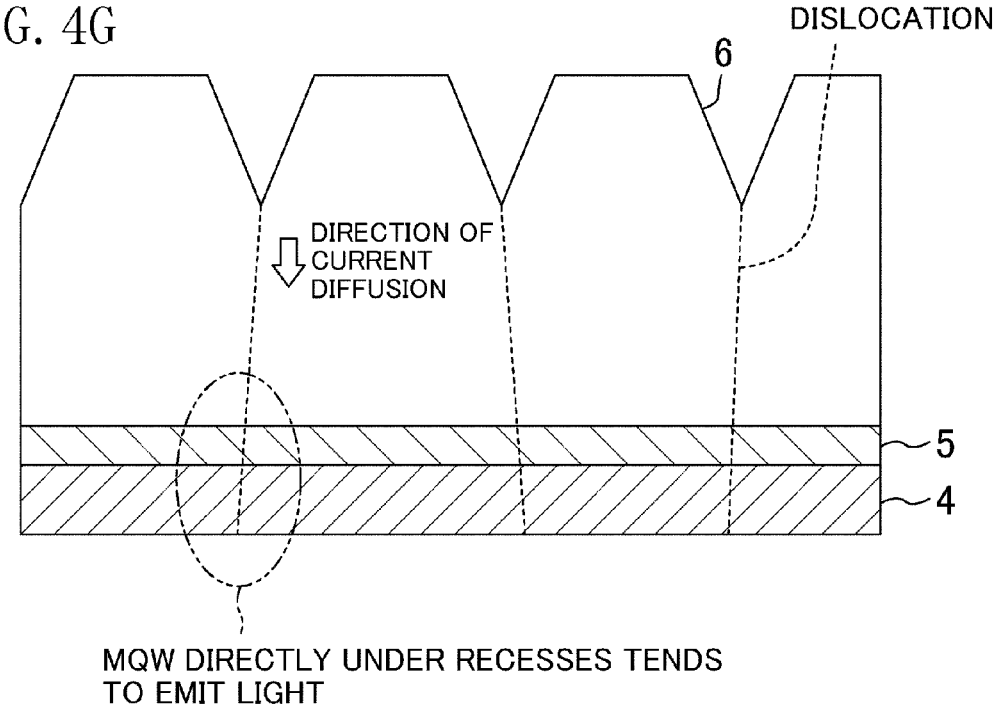
FIG. 4G is a schematic cross-sectional view illustrating a step of the manufacturing method of the light-emitting device according to the second exemplary embodiment.

The periodic structure 316 is provided for the purpose of changing the direction of the edge dislocation occurring between the substrate and the nitride semiconductor. As shown in FIG. 4G, a current tends to flow directly under recesses of the unevenness structure. When dislocation exists in the light-emitting layer directly under the recesses, the dislocation exists in the part of the light-emitting layer in which a current tends to flow, thereby reducing luminous efficiency. Then, the direction of dislocation occurring in growing the nitride semiconductor from the substrate is changed by the periodic structure 316, and the recesses of the unevenness structure are located on the dislocation of which direction is changed. As a result, the structure without dislocation in the light-emitting layer directly under the recesses can be obtained. In this structure, since no dislocation occurs in the light-emitting layer directly under the recesses where a current tends to flow, the luminous efficiency can be improved.

Figure 9B:
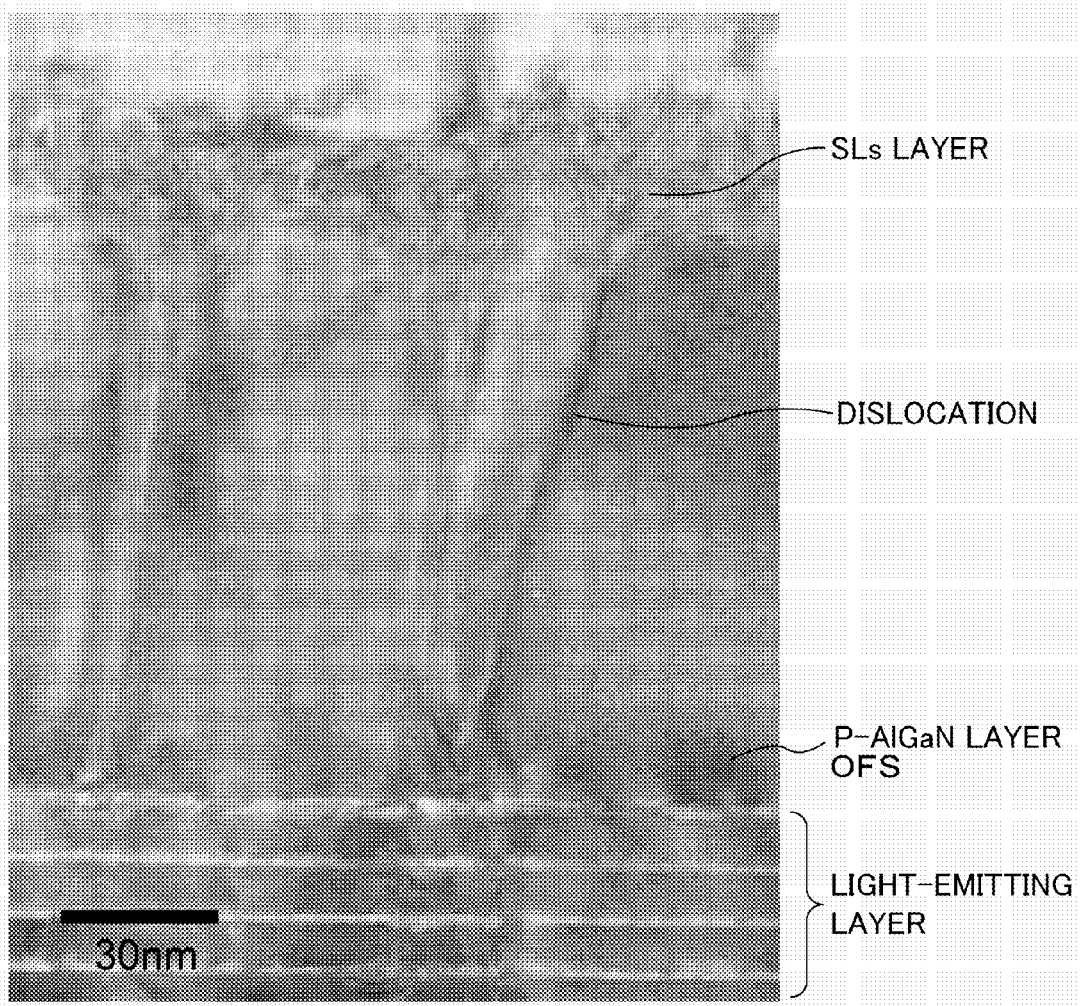
FIG. 9B is a TEM image of the light-emitting device according to the fourth exemplary embodiment.

FIG. 9B is an actual TEM image and shows that the direction of the dislocation is changed.

While in this exemplary embodiment, an example has been described using an LED, the periodic structure 316 is applicable to the LD shown in the third exemplary embodiment.

Fifth Exemplary Embodiment

Figure 10:
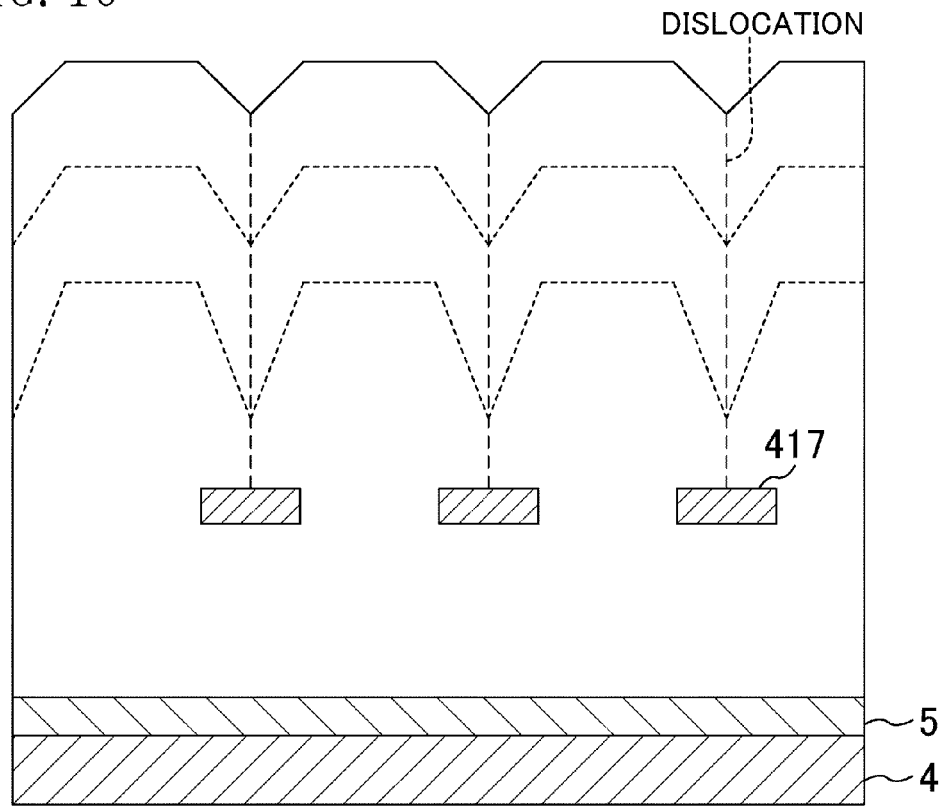
FIG. 10 is a schematic cross-sectional view illustrating a light-emitting device of a fifth exemplary embodiment.

A light-emitting device of a fifth exemplary embodiment will be described. FIG. 10 is a cross-sectional view of an LED according to the fifth exemplary embodiment of the present disclosure, and shows a part from a light-emitting layer to a p-type layer having unevenness.

The LED of this exemplary embodiment has basically the same structure as the LED of the second exemplary embodiment. However, as shown in FIG. 10, a nanomask 417 is inserted between the unevenness and the light-emitting layer in the first p-type semiconductor layer 6. In this respect, this exemplary embodiment differs from the first exemplary embodiment. The nanomask 417 may be made of AlN, SiN, SiC, etc. and is preferably in-situ formed. The mask size preferably ranges from 1 nm to 100 nm in view of growth time and acceleration of growth on the mask.

With this structure, three-dimensional growth caused by a difference in lattice constant forms the unevenness structure. Furthermore, the unevenness structure can be in-situ formed to reduce costs. Since dislocation is not necessary, the unevenness can be formed without reducing luminous efficiency.

While the LED is described in this exemplary embodiment, the nanomask 417 is applicable to the LED shown in the third exemplary embodiment.

The above-described exemplary embodiments can be freely modified within the technical spirit of the present disclosure. The drawings are merely schematic views illustrating exemplary embodiments of the present disclosure except for the graph of FIG. 5 showing the I-V characteristics and may partially include exaggeration. However, the present disclosure is not limited to the structures shown in the drawings.

The present disclosure achieves an increase in luminance of a light-emitting nitride semiconductor device such as a light-emitting diode, a semiconductor laser diode, etc. made of nitride semiconductor, and reduction in costs; and is thus industrially highly useful. As the light-emitting device of the present disclosure, the unevenness structure in which the p-type nitride semiconductor layer has a (1-101) plane has been described. As another device, a field effect transistor (FET) using a nitride semiconductor can be formed on a Si substrate. Another element can be formed with a nitride semiconductor device to constitute a part of an integrated device.

What is claimed is:

1. A nitride semiconductor device comprising:
   a first nitride semiconductor layer having a C-plane as a growth surface, and unevenness in an upper surface; and
   a second nitride semiconductor layer formed on the first nitride semiconductor layer to be in contact with the unevenness, and having p-type conductivity, wherein
   the second nitride semiconductor layer located directly on a sidewall of the unevenness has a p-type carrier concentration of $1\times10^{18}/cm^3$ or more, and
   edge dislocation is positioned directly under recesses of the unevenness.

2. The nitride semiconductor device of claim 1, wherein carbon (C) is implanted into the second nitride semiconductor layer as p-type impurities.

3. The nitride semiconductor device of claim 2, wherein at least one of Mg, Zn, Ca, or Be is implanted as the p-type impurities in addition to the C.

4. The nitride semiconductor device of claim 2, wherein at least one of Si or Ge is implanted into the second nitride semiconductor layer.

5. The nitride semiconductor device of claim 1, wherein p-type impurities are distributed along a form of the unevenness at the interface between the first nitride semiconductor layer and the second nitride semiconductor layer.

6. The nitride semiconductor device of claim 1, wherein a surface of a sidewall of the unevenness has mainly nitrogen polarity.

7. The nitride semiconductor device of claim 1, wherein a sidewall of the unevenness includes a surface having plane orientation of a (1-101) plane, a (11-22) plane, or a (1-102) plane.

8. The nitride semiconductor device of claim 1, wherein the unevenness is in a form of a hexagonal pyramid or a truncated hexagonal pyramid.

9. A nitride semiconductor device comprising:
   an n-type nitride semiconductor layer, a light-emitting layer, and a first p-type nitride semiconductor layer, which are sequentially formed using a C-plane as a growth surface, wherein
   unevenness is provided in the first p-type nitride semiconductor layer,
   a second p-type nitride semiconductor layer formed on the first p-type nitride semiconductor layer to be in contact with the unevenness is further provided,
   the second p-type nitride semiconductor layer located directly on a sidewall of the unevenness has a p-type carrier concentration of $1\times10^{18}/cm^3$ or more, and
   edge dislocation is positioned directly under recesses of the unevenness.

10. The nitride semiconductor device of claim 9, wherein carbon (C) is implanted into the second p-type nitride semiconductor layer as p-type impurities.

11. The nitride semiconductor device of claim 10, wherein at least one of Mg, Zn, Ca, or Be is implanted as the p-type impurities in addition to the C.

12. The nitride semiconductor device of claim 10, wherein at least one of Si or Ge is implanted into the second p-type nitride semiconductor layer.

13. The nitride semiconductor device of claim 9, wherein p-type impurities are distributed along a form of the unevenness at the interface between the first p-type nitride semiconductor layer and the second p-type nitride semiconductor layer.

14. The nitride semiconductor device of claim 9, wherein a surface of a sidewall of the unevenness has mainly nitrogen polarity.

15. The nitride semiconductor device of claim 9, wherein a sidewall of the unevenness includes a surface having plane orientation of a (1-101) plane, a (11-22) plane, or a (1-102) plane.

16. The nitride semiconductor device of claim 9, wherein the unevenness is in a form of a hexagonal pyramid or a truncated hexagonal pyramid.

17. The nitride semiconductor device of claim 9, wherein the edge dislocation is not provided in the light-emitting layer located directly under the recesses of the unevenness.

18. The nitride semiconductor device of claim 17, further comprising
   a periodic structure provided between the first p-type nitride semiconductor layer and the light-emitting layer, and made of nitride semiconductor, wherein
   the periodic structure changes a direction of the edge dislocation.

19. The nitride semiconductor device of claim 18 wherein
   the periodic structure is formed by periodically stacking nitride semiconductor layers of different composition, and
   each of the layers of the periodic structure contains at least one of In, Al, or Ga as a constituent element.

20. A nitride semiconductor device comprising:
   an n-type nitride semiconductor layer, a light-emitting layer, and a first p-type nitride semiconductor layer, which are sequentially formed using a C-plane as a growth surface, wherein
   unevenness is provided in the first p-type nitride semiconductor layer;
   a second p-type nitride semiconductor layer formed on the first p-type nitride semiconductor layer to be in contact with the unevenness is further provided,
   the second p-type nitride semiconductor layer located directly on a sidewall of the unevenness has a p-type carrier concentration of $1\times10^{18}/cm^3$ or more; and
   a nanomask provided between the first p-type nitride semiconductor layer and the light-emitting layer,
   wherein recesses of the unevenness are located directly on the nanomask.

21. The nitride semiconductor device of claim 20, wherein the nanomask is made of $Al_xGa_{1-x}N$, where $0<x\leqq1$, SiN, or SiC.

22. A manufacturing method of a nitride semiconductor device comprising:
   (a) forming a first nitride semiconductor layer, which includes edge dislocation, on a substrate using a C-plane as a growth surface;
   (b) forming unevenness on a surface of the first nitride semiconductor layer; and
   (c) forming a second p-type nitride semiconductor layer to be in contact with the unevenness of the first nitride semiconductor layer; wherein
   the edge dislocation is positioned directly under recesses of the unevenness.

23. The method of claim 22, wherein carbon (C) is implanted into the second nitride semiconductor layer as p-type impurities in the (c).

24. A manufacturing method of a nitride semiconductor device comprising:

(a) sequentially forming an n-type nitride semiconductor layer, a light-emitting layer, and a first p-type nitride semiconductor layer on a substrate using a C-plane as a growth surface;
(b) forming unevenness on a surface of the first p-type nitride semiconductor layer;
(c) forming a second p-type nitride semiconductor layer formed to be in contact with the unevenness of the first nitride semiconductor layer;
(d) removing the substrate, and
(e) forming a metal film of a single layer or a multilayer reflecting light with a light-emitting wavelength of the light-emitting layer on an exposed surface of the n-type nitride semiconductor layer exposed by removing the substrate.

25. The method of claim 24, wherein the metal film has a thickness of 10 μm or more in the (e).

26. The method of claim 24, wherein at least a part of the metal film is formed by plating in the (e).

27. The method of claim 24, wherein the metal film is made by at least one of Cu, Ag, Al, or Au in the (e).

* * * * *